(12) United States Patent
Hayashi

(10) Patent No.: US 6,410,961 B1
(45) Date of Patent: Jun. 25, 2002

(54) THIN FILM SEMICONDUCTOR DEVICE AND DISPLAY DEVICE

(75) Inventor: Hisao Hayashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/212,383

(22) Filed: Dec. 16, 1998

(30) Foreign Application Priority Data

Dec. 18, 1997 (JP) .......................................... 09-364554

(51) Int. Cl.$^7$ ............................................ H01L 29/786
(52) U.S. Cl. ........................ 257/349; 257/72; 257/435; 257/294; 257/59
(58) Field of Search ............................. 257/72, 59, 53, 257/294, 349, 435

(56) References Cited

U.S. PATENT DOCUMENTS

| | | | | |
|---|---|---|---|---|
| 5,371,398 A | * | 12/1994 | Nishihara | 257/435 |
| 5,712,494 A | * | 1/1998 | Akiyama | 257/294 |
| 5,747,830 A | * | 5/1998 | Okita | |
| 5,821,565 A | * | 10/1998 | Matsuzaki | 257/72 |
| 5,834,797 A | * | 11/1998 | Yamanaka | 257/72 |

\* cited by examiner

Primary Examiner—Jerome Jackson, Jr.
(74) Attorney, Agent, or Firm—Sonnenschein, Nath & Rosenthal

(57) ABSTRACT

A thin film semiconductor device comprising an insulating substrate, a plurality of thin film transistors integrated on the insulating substrate, each thin film transistor including a gate electrode, a gate insulating film, a semiconductor thin film and an interlayer insulating film which are laminated in this order from the lower side, and the semiconductor thin film being formed with a channel region confronting the gate electrode, and a source region and a drain region which are located at both sides of the channel region, and a conductor film which is formed on the surface of the interlayer insulating film so as to be overlapped with the channel region. A display device having a pair of insulating substrates, electrooptical material held in the gap between the insulating substrates, a counter electrode formed in one of the insulating substrates, and a plurality of pixel electrodes and a plurality of thin film transistors which are integrated on the other insulating substrate.

7 Claims, 5 Drawing Sheets

THIN FILM SEMICONDUCTOR DEVICE AND DISPLAY DEVICE

BACKGROUND OF THE INVENTION

1. Field of the Invention

The present invention relates to a thin film semiconductor device in which bottom gate type thin film transistors each containing an active layer of polycrystalline silicon or the like are formed in an integration structure on an insulating substrate, and also a display device using a thin film semiconductor device as a driving board, and more particularly to a technique for improving the characteristics of a bottom gate type thin film transistor.

2. Description of the Related Art

A thin film semiconductor device is suitably used as a driving board for display in an active matrix type liquid crystal display or the like, and its development is being positively promoted at present. Polycrystalline silicon or amorphous silicon is used for an active layer (channel region) of a thin film transistor. Particularly, more attention is paid to the polycrystalline silicon thin film transistor because it can implement a compact and high-precision active matrix type color liquid crystal display device. According to this technique, a thin film transistor is formed as a pixel switching element on an insulating substrate formed of transparent glass or the like, and thus polycrystalline silicon thin films which are practically used as only electrode material or resistance material in a conventional semiconductor technique are used for active layers. This technique is only the technique of implementing thin film transistors for high-performance switching elements which can be produced in a high-density design to achieve such image quality as required in the market. At the same time, this technique can also implement such a design that a peripheral circuit portion which has been hitherto provided as an external IC is formed on the same board as a pixel array portion in the same process.

A top gate structure has been hitherto mainly adopted for thin film transistors. In the top gate structure, a semiconductor thin film is formed on an insulating substrate, and then a gate electrode is formed through a gate insulating film on the semiconductor thin film. In a thin film semiconductor device for a liquid crystal display, a low-cost and large-size glass plate is used as the insulating substrate.

The glass plate contains a large amount of metal impurities such as Na, etc., and thus the impurities such as Na, etc. are localized in accordance with a driving voltage for the thin film transistor. Accordingly, the characteristic of the thin film transistor is varied in accordance with the electric field due to the localization of the metal impurities. In order to countermeasure this phenomenon, a bottom gate structure has been recently developed. In the bottom gate structure, a gate electrode formed of a metal film or the like is disposed on an insulating substrate of a glass plate or the like, and then a semiconductor thin film is formed through a gate insulating film on the gate electrode. The gate electrode has an effect of shielding the electric field in the glass plate, and from the structure viewpoint, the bottom gate structure is more excellent on the point of reliability than the top gate structure.

FIG. 1 is a cross-sectional view showing a conventional thin film semiconductor device.

The thin film semiconductor device shown in FIG. 1 is achieved by integrating thin film transistors 3 having the bottom gate structure on an insulating substrate 1. For simplification of illustration, only one thin film transistor is illustrated. The thin film transistor 3 has the bottom gate structure comprising a gate electrode 5, a gate insulating film 4, a semiconductor thin film 2 and an interlayer insulating film 9 which are laminated in this order from the lower side. In the thin film transistor 3, a channel region 20 confronting the gate electrode 5, and a source region 7 and a drain region 8 which are located at both sides of the channel region 20 are formed in the semiconductor thin film 2. A stopper 6 is provided just above the channel region 20 to protect the channel region 20. The thin film transistor 3 thus formed is coated by the interlayer insulating film 9. Conductor films 10S, 10D of aluminum or the like are formed on the interlayer insulating film 9, and electrically connected to the source region 7 and the drain region 8 through contact holes formed in the interlayer insulating film 9, respectively. The conductor films 10S, 10D are subjected to a patterning treatment to serve as an electrode and a wire, respectively. When thin film semiconductor device thus formed is applied to a driving board for a display device, the thin film transistor 3 and the conductor films 10S, 10D are coated by a planarization film 12. An electrooptical material 50 such as liquid crystal or the like is superposed on a planarization film 12.

In the bottom gate type thin film transistor 3, the upper portion of the channel region 20 is coated by the interlayer insulating film 9 formed of $SiO_2$, SiN or the like and the planarization film 12 formed of acrylic resin or the like. This structure induces no special problem in a usual case. However, if it is installed into a display device or the like, it induces a problem on reliability. That is, positive charges occur at the interface between the planarization film 12 and the electrooptical material 50 on the planarization film 12. Specifically, water or ions in the electrooptical material 50 are attracted by the potential of the gate electrode 5 or the like. These materials are trapped as the positive charges at the interface between the planarization film 12 and the electrooptical material 50. Further, the water or the ions are downwardly diffused through the planarization film 12, and the positive charges occur at the interface between the interlayer insulating film 9 and the planarization film 12. These positive charges produce a back channel in the channel region 20, so that the threshold voltage Vth of the thin film transistor 3 is varied or current leak occurs. As described above, the thin film transistor having the bottom gate structure has such an inherent factor that the characteristic thereof is varied under the effect of the external impurities in accordance with its using condition.

FIG. 2 is a schematic diagram showing an energy band of the channel region 20. The channel region 20 is sandwiched by the interlayer insulating film 9 and the gate insulating film 4 from the upper and lower sides. The channel region 20 comprises a semiconductor thin film of Si or the like, and each of the interlayer insulating film 9 and the gate insulating film 4 is formed of an $SiO_2$, film. A metal gate electrode 5 is disposed through the gate insulating film 4 at the lower side of the channel region 20. In this system, the conductive band energy end EC has a profile indicated by a solid line of FIG. 2. Here, EF in FIG. 2 represents the Fermi level. Since EC is reduced at the gate insulating film 4 side, the original channel CH is produced along the interface between the channel region 20 and the gate insulating film 4. However, when the positive charges are stocked on the surface of the interlayer insulating film 9, EC falls at the back surface side of the interlayer insulating film 9 as indicated by a dotted line, and the back channel BCH is formed along the interface between the channel region 20 and the interlayer insulating film 9. This induces the variation of the threshold voltage and the current like to the thin film transistor having the bottom gate structure.

SUMMARY OF THE INVENTION

The present invention has been implemented to overcome the above problem, and according to an aspect of the present invention, a thin film semiconductor device comprises an insulating substrate, a plurality of thin film transistors integrated on the insulating substrate, each thin film transistor including a gate electrode, a gate insulating film, a semiconductor thin film and an interlayer insulating film which are laminated in this order from the lower side, and the semiconductor thin film being formed with a channel region confronting the gate electrode, and a source region and a drain region which are located at both sides of the channel region, and a conductor film which is formed on the surface of the interlayer insulating film so as to be overlapped with the channel region.

In the thin film semiconductor device, the conductor film is connected to the same potential as the source region or the drain region.

In the thin film semiconductor device, the conductor film is connected to a potential which is different from that of the source region or the drain region.

In the above thin film semiconductor device, the different potential is a gate potential.

In the above thin film semiconductor device, the different potential is a floating potential.

In the above thin film semiconductor device, the conductor film has a width dimension larger than that of the channel region.

In the above thin film semiconductor device, the conductor film is overlapped with a portion smaller than the overall length of the channel region.

In the above thin film semiconductor device, the thin film transistor includes a pair of channel regions which confront a pair of gate electrodes and formed in the semiconductor thin film, and a conductor film is formed on the surface of the interlayer insulating film so as to be overlapped with at least one of the channel regions.

According to another aspect of the present invention, a display device having a pair of insulating substrates which are connected to each other through a predetermined gap, and electrooptical material held in the gap, comprises a counter electrode formed in one of the insulating substrates, and a plurality of pixel electrodes and a plurality of thin film transistors which are integrated on the other insulating substrate, wherein each thin film transistor comprises a gate electrode, a gate insulating film, a semiconductor thin film and an interlayer insulating film which are laminated in this order from the lower side, the semiconductor thin film is formed with a channel region confronting the gate electrode, and a source region and a drain region located at both sides of the channel region, and a conductor film is formed on the surface of the interlayer insulating film so as to be overlapped with the channel region.

In the above display device, the conductor film is connected to the same potential as the source region or the drain region.

In the above display device, the conductor film is connected to a potential which is different from that of the source region or the drain region.

In the above display device, the different potential is a gate potential.

In the above display device, the different potential is a floating potential.

In the above display device, the conductor film has a width dimension larger than that of the channel region.

In the above display device, the conductor film is overlapped with a portion smaller than the overall length of the channel region.

In the above display device, the thin film transistor includes a pair of channel regions which confront a pair of gate electrodes and are formed in the semiconductor thin film, and a conductor film is formed on the surface of the interlayer insulating film so as to be overlapped with at least one of the channel regions.

According to the present invention, the upper portion of the channel region is covered by the conductor film. Therefore, when positive charges are supplied from the outside, the channel region is electrically shielded by the potential of the conductor film, so that no back channel is formed. Accordingly, the variation of the threshold voltage and the current leak of the thin film transistor having the bottom gate structure can be suppressed.

DETAILED DESCRIPTION OF THE PREFERRED EMBODIMENTS

Preferred embodiments according to the present invention will be described with reference to the accompanying drawings.

Figure 3A:
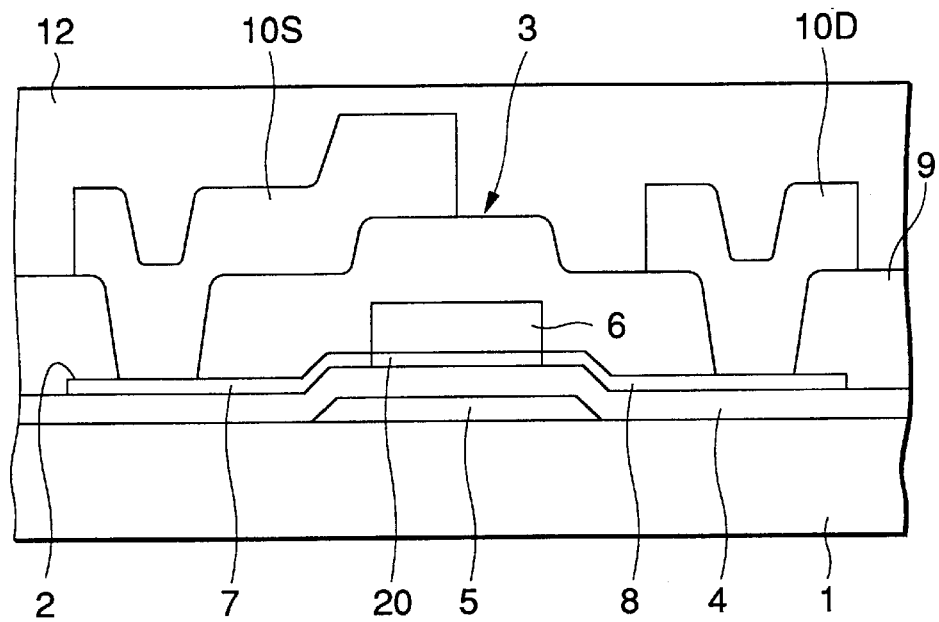
FIG. 3A is a schematic partial cross-sectional view of an embodiment of a thin film semiconductor device according to the present invention and FIGS. 3B and 3C are partial plan views of FIG. 3A.
Figure 3B:
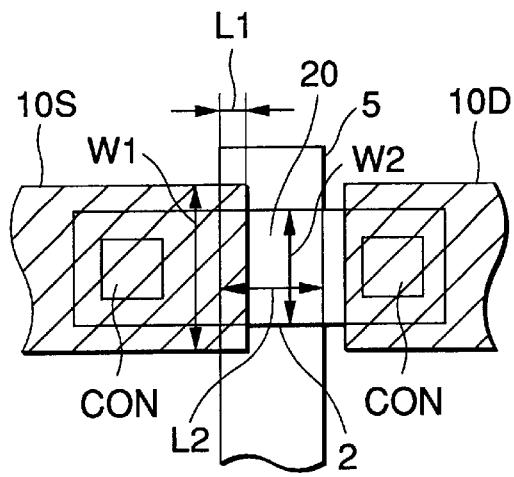
Figure 3C:
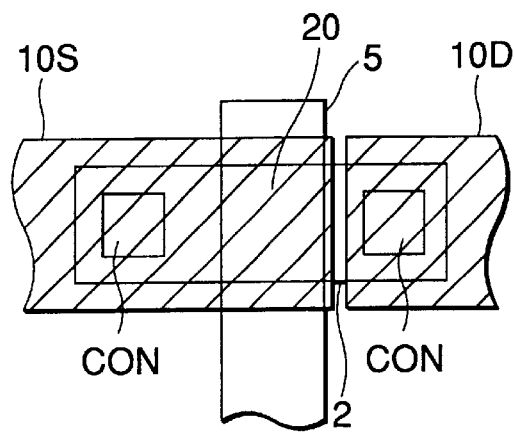

FIG. 3A is a schematic partial cross-sectional view of an embodiment of a thin film semiconductor device according to the present invention and FIGS. 3B and 3C are partial plan views of FIG. 3A. As shown in FIG. 3A, the thin film semiconductor device of this embodiment is obtained by integrating thin film transistors 3 on an insulating substrate 1 formed of glass or the like. In order to clarify the understanding of the present invention, only one thin film transistor 3 is shown. The thin film transistor 3 has the bottom gate structure, and it includes a gate electrode 5, a gate insulating film 4, a semiconductor thin film 2 and an interlayer insulating film 9 which are laminated in this order from the lower side. The gate electrode 5 is formed by patterning a metal film, the gate insulating film 4 comprises a monolayer film or a multilayered film, the semiconductor thin film 2 is formed of polycrystalline silicon or the like, and the interlayer insulating film 9 is formed of $SiO_2$ or the like. A channel region 20 confronting the gate electrode 5 and both of a source region 7 and a drain region 8 which are located at both the sides of the channel region 20 are formed in the semiconductor thin film 2 serving as an element region of the thin film transistor 3. The just upper portion of the channel region 20 is coated by a stopper 6 formed of SiO$_2$ or the like. Conductor films 10S, 10D of aluminum or the like are formed on the interlayer insulating film 9 by a patterning treatment. The conductor film 10S is electrically connected to the source region 7 of the thin film transistor 3 through a contact hole formed in the interlayer insulating film 9. Likewise, the conductor film 10D is electrically connected to the drain region 8 of the thin film transistor 3 through a contact hole formed in the interlayer insulating film 9. These conductor films 10S, 10D function as an electrode and a wire. The conductor films 10S, 10D are coated by a planarization film 12 formed of acrylic resin or the like.

This embodiment is characterized as follows. That is, the conductor 10S is formed on the surface of the interlayer insulating film 9 so as to extend along a portion which is overlapped with the channel region 20, thereby electrically shielding the channel region 20 from the outside. With the above construction, formation of a back channel in the channel region 20 can be prevented, and the variation of the threshold voltage and the current leak of the thin film transistor 3 can be suppressed.

In this embodiment, a part of the conductor 10S which is patterned as the source electrode and the signal wire is used as electrical shield. That is, the conductor film 10S for shield is connected to the same potential as the source region 7. If occasions demand, the conductor film 10D which is patterned as the drain electrode may be used for electrical shield. Alternatively, an electrical shielding conductor film may be formed just above the channel region 20 separately from the source electrode and the drain electrode. In this case, the electric shielding conductor film may be connected to a potential (for example, gate potential) which is different from the potential of the source region and the potential of the drain region. Even when it is connected to a floating potential, it can function as electric shield.

FIG. 3B is a plan view showing the thin film transistor 3 shown in FIG. 3A.

The islandish semiconductor thin film 2 is formed so as to cross the gate electrode 5 and so that the gate insulating film is sandwiched between the gate electrode 5 and the semiconductor thin film 2. The overlapped portion of the semiconductor thin film 2 with the gate electrode 5 serves as the channel region 20. The conductor film 10S is connected to the source region through the contact hole CON formed in the interlayer insulating film, and the conductor film 10D is likewise connected to the drain region through the contact hole CON formed in the interlayer insulating film. The conductor film 10S at the source side is extended so as to be overlapped with the channel region 20. The conductor film 10S has a width dimension W1 larger than the width dimension W2 of the channel region 20, whereby the current leak passage between the source region and the drain region can be perfectly shielded. Further, the conductor film 10S is overlapped with a portion L1 which is smaller than the overall length L2 of the channel region. By electrically shielding at least a part of the channel region 20, the current leak can be suppressed. FIG. 3C shows a modification in which the conductor film 10S is extended so as to be overlapped with the overall channel region 20.

Figure 1:
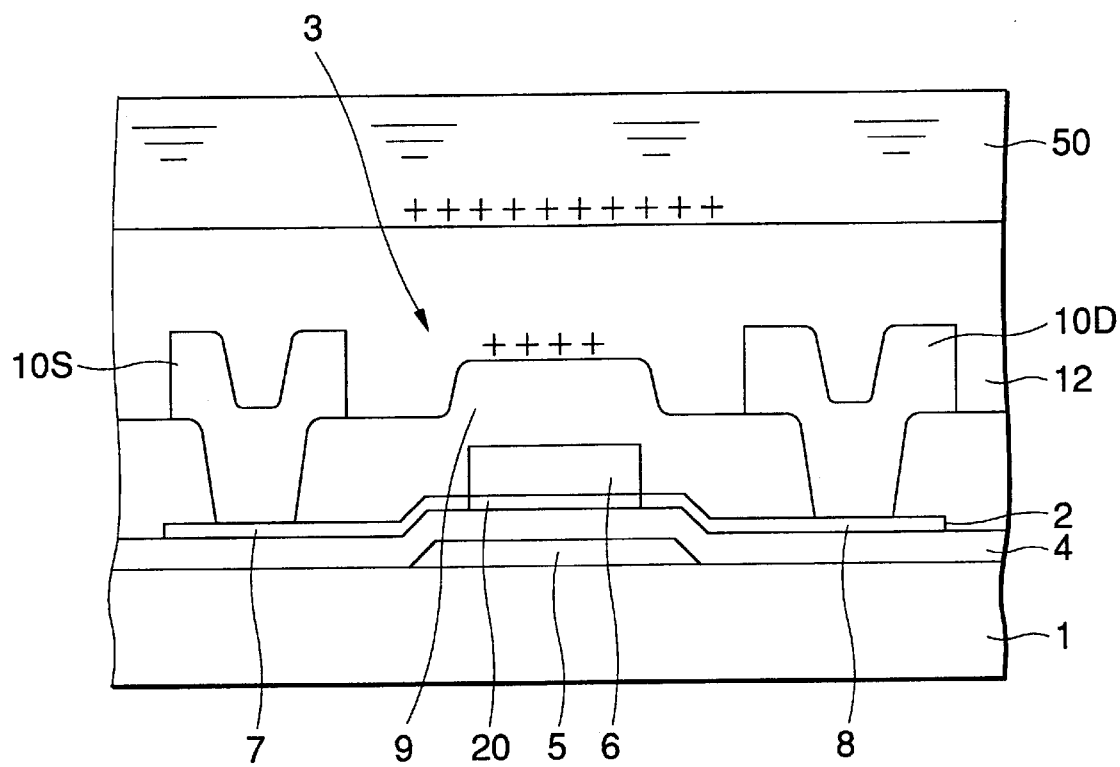
FIG. 1 is a partial cross-sectional view showing a conventional thin film semiconductor device.
Figure 2:
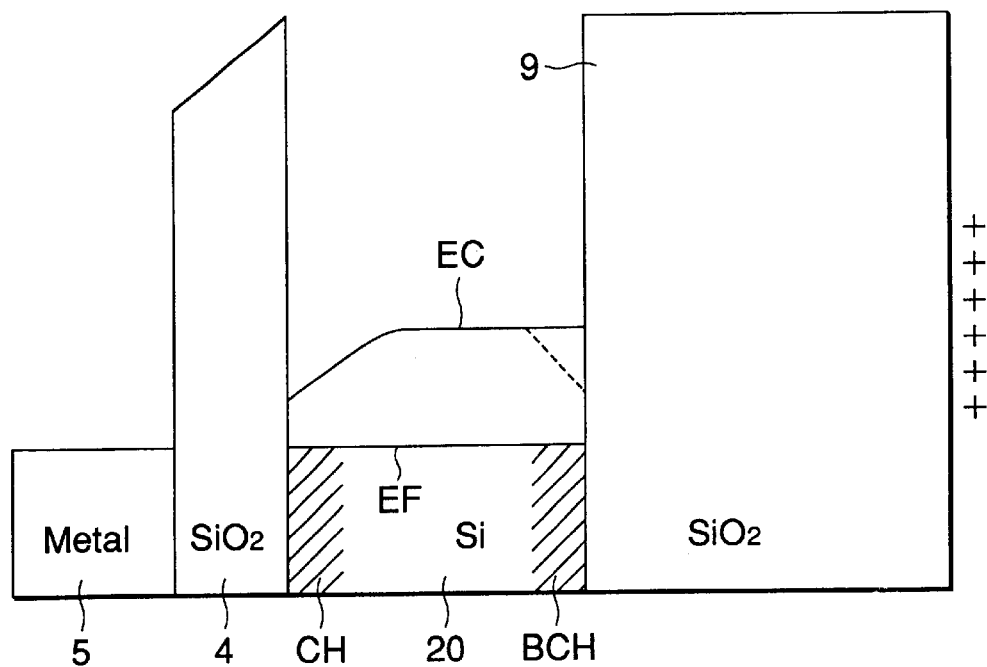
FIG. 2 is an energy band diagram showing the problem of the conventional thin film semiconductor device.
Figure 4A:
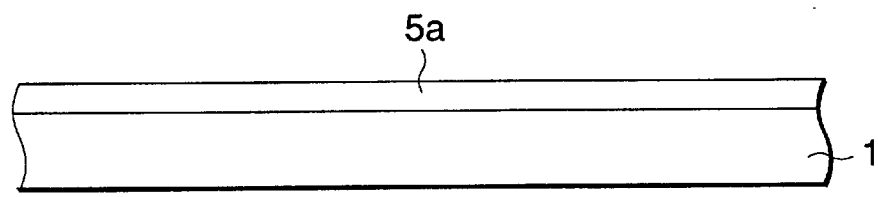
FIGS. 4A to 4E are cross-sectional views showing a series of steps of manufacturing the thin film semiconductor device of FIG. 1.

FIGS. 4A to 4E are cross-sectional views of the thin film semiconductor device which show a series of steps of the manufacturing method of the thin film semiconductor device shown in FIG. 1. First, as shown in FIG. 4A, a metal film 5a is formed on the overall surface of the insulating substrate 1 of glass or the like by a sputtering method. The metal film 5a preferably has low resistance, and further it preferably has a high melting point. Therefore, W, Cr, Mo, Ti is generally used for the metal film 5a. The thickness of the metal film 5a is set to about 100 nm, for example.

Figure 4B:
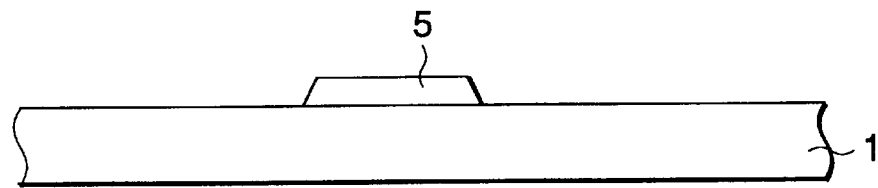
Figure 4C:
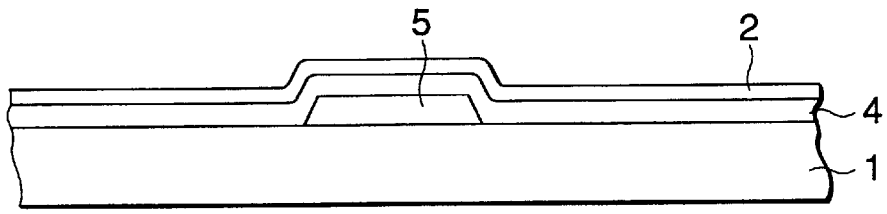

Subsequently, as shown in FIG. 4B, the metal film 5a is patterned by an isotropic dry etching treatment to be processed into the gate electrode 5. With the isotropic dry etching treatment, the sectional shape of the gate electrode 5 can be processed into a trapezoidal shape. That is, the end face of the gate electrode 5 is tapered in the range of 5 degrees to 15 degrees. Subsequently, as shown in FIG. 4C, SiO$_2$ is deposited at a thickness of 100 to 200 nm by a plasma CVD method (PE-CVD method) to form the gate insulating film 4 with which the gate electrode 5 is coated. Further, amorphous silicon is deposited at a thickness of 20 to 60 nm to form the semiconductor thin film 2. The gate insulating film 4 and the semiconductor thin film 2 can be continuously grown in the same film forming chamber with keeping the vacuum condition. Here, the insulating substrate 1 is heated up to 400° C. The amorphous silicon semiconductor thin film 2 formed by the PE-CVD method contains about 10% hydrogen, and this hydrogen is separated by a heat treatment at 400° C. Thereafter, for example, an XeCl excimer laser beam of 308 nm in wavelength is irradiated to crystallize the semiconductor thin film 2. The amorphous silicon is melted by the energy of the laser beam, and it becomes polycrystal when it is solidified. At this time, since the gate electrode 5 is processed in a trapezoidal shape, thereby preventing step breaking of the semiconductor thin film 2 at the step portion.

Figure 4D:
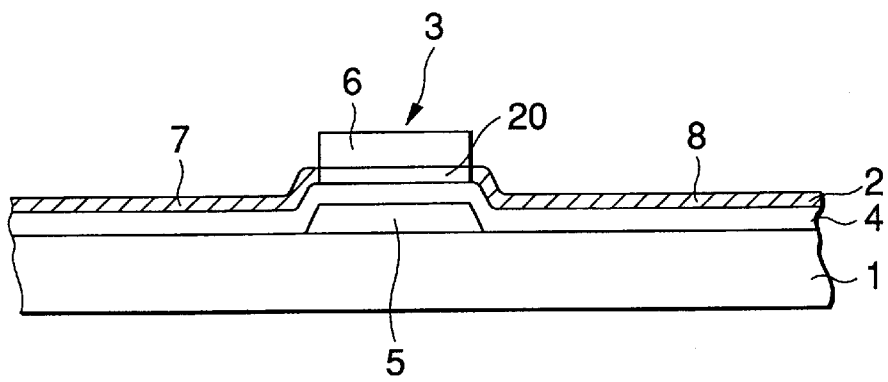

Further, as shown in FIG. 4D, SiO$_2$ is deposited on the semiconductor thin film 2 by the PE-CVD method. The film thickness thereof is set to about 200 nm. The SiO$_2$ film thus formed is patterned by using a back-side exposure technique to be processed into the stopper 6. That is, the back-side exposure is performed by using the gate electrode 5 having the shielding performance as a mask, the stopper 6 which is matched with the gate electrode 5 with self alignment can be obtained. Here, impurities (for example, phosphorus) at a predetermined concentration are doped into the semiconductor thin film 2 with an ion doping method by using the stopper 6 as a mask, whereby the source region 7 and the drain region 8 are formed. Further, the channel region 20 into which no impurities are doped remains just below the stopper 6. Through the above process, the basic structure of the thin film transistor having the bottom gate structure can be obtained.

Figure 4E:
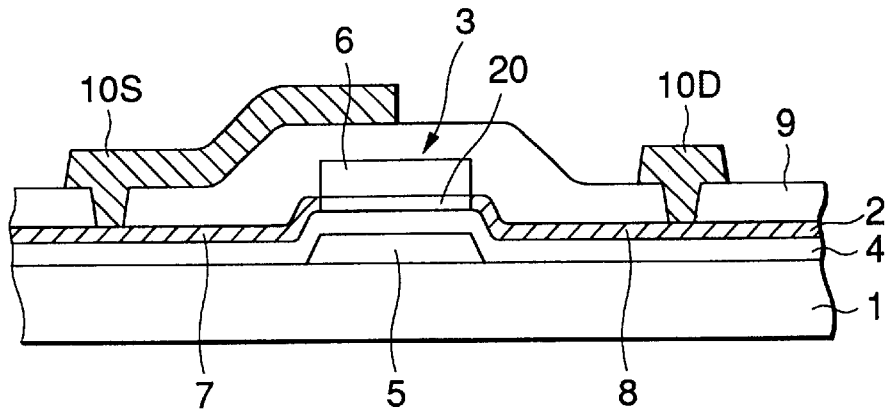

Finally, as shown in FIG. 4E, the laser beam is irradiated again to activate the doped atoms. The same method as the crystallization is used, and the irradiation is sufficiently performed with weak energy because it is unnecessary to enlarge the crystals. Thereafter, SiO$_2$ is deposited at a thickness of 300 nm for insulation between wires, thereby forming the interlayer insulating film 9. After contact holes are formed in the interlayer insulating film 9, metal aluminum is deposited by the sputtering method and then patterned in a predetermined form to be processed into the conductor films 10S, 10D. At this time, the mask for patterning is improved so that the conductor film 10S at the source side is extended onto the channel region 20. With this structure, even when positive charges are supplied from the external, no back channel is formed because the channel region 20 is shielded by the potential of the conductor film 10S. Accordingly, any variation of the threshold voltage and any current leak do not occur in the bottom gate type thin film transistor 3. The conductor film 10S may cover the overall channel region 20, however, it is sufficient to cover a part of the channel region 20 by the conductor film 10. However, it is necessary to avoid a defective portion of the conductor film 10S from occurring along the width direction of the channel region.

Figure 5:
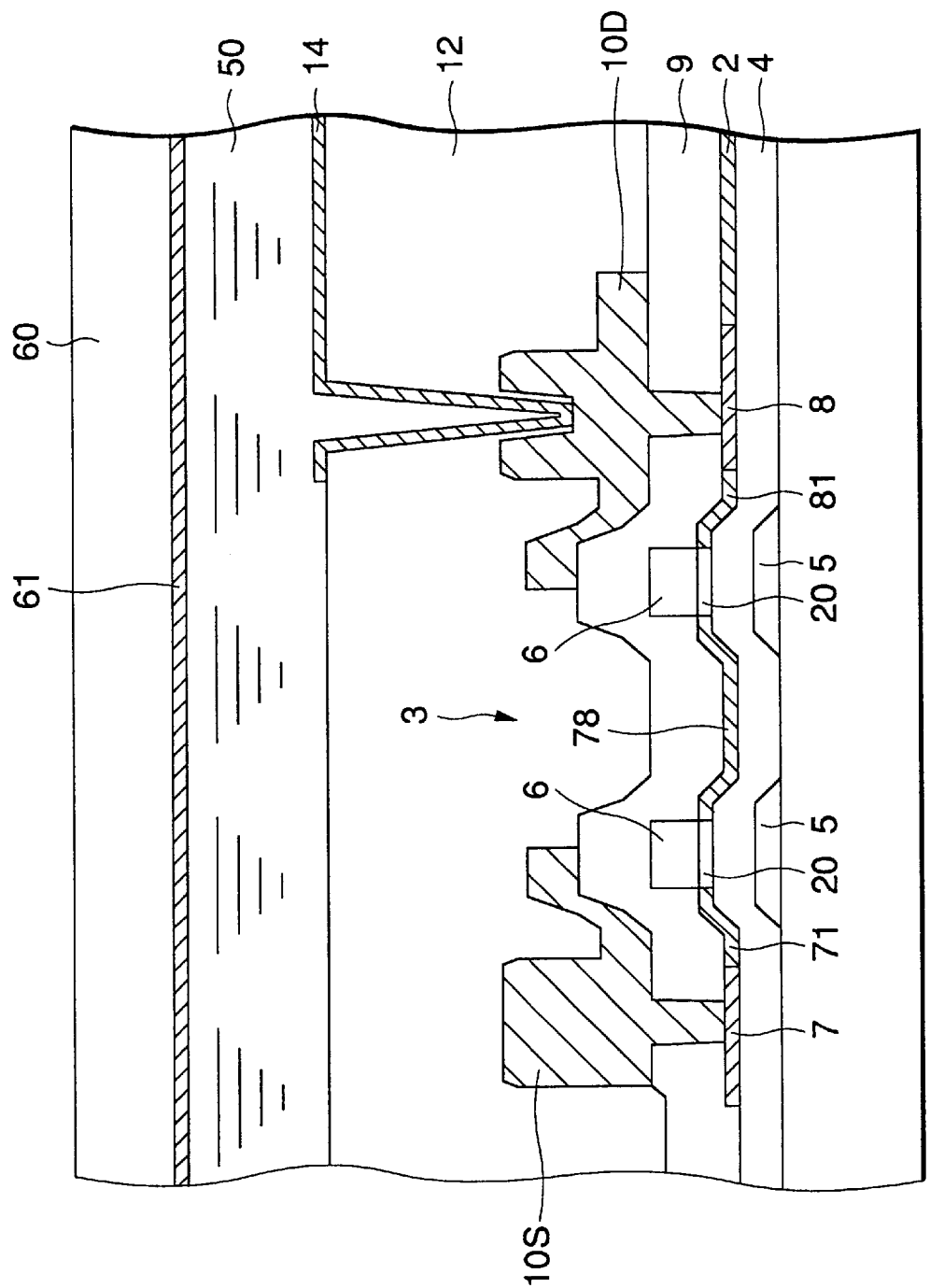
FIG. 5 is a partial cross-sectional view showing another embodiment of the thin film semiconductor device according to the present invention.

FIG. 5 is a partial cross-sectional view showing another embodiment of the thin film semiconductor device according to the present invention.

As shown in FIG. 5, the thin film semiconductor device of this embodiment is achieved by integrating thin film transistors 3 having the bottom gate structure on an insulating substrate 1 of glass or the like, each thin film transistor 3 including a gate electrode 5, a gate insulating film 4, a semiconductor thin film 2 and an interlayer insulating film 9 which are laminated in this order from the lower side. The thin film semiconductor device of this embodiment is used for a driving board of an active matrix type display device. Therefore, each thin film transistor 3 is connected to a pixel electrode 14. The thin film transistor 3 has a double gate structure to enhance the reliability thereof. That is, in the thin film transistor 3, a pair of channel regions 20 which confront a pair of gate electrodes 5 are formed in the semiconductor thin film 2.

The gate electrode 5 is coated by the gate insulating film 4 of $SiO_2$ or the like. The semiconductor thin film 2 of polycrystalline silicon or the like is formed on the gate insulating film 4. Further, a stopper 6 is formed on the semiconductor thin film 2 by the patterning treatment so as to be matched with each gate electrode 5. The portion of the semiconductor thin film 2 which locates just below the stopper 6 serves as the channel region 20. A source region 7 and a drain region 8 which are obtained by doping high-concentration impurities are formed in the semiconductor thin film 2. Further, LDD regions 71, 78, 81 obtained by doping low-concentration impurities are also formed. The thin film transistor 3 thus constructed is coated by an interlayer insulating film 9 formed of $SiO_2$ or the like. A conductor film 10S which also serves as a signal wire is formed on the interlayer insulating film 9 by the patterning treatment, and is electrically connected to the source region of the thin film transistor 3 through a contact hole. The conductor film 10S is formed of aluminum or the like, and it extends to the upper portion of the channel region 20 and functions as an electrical shield. Likewise, a conductor film 10D is formed at the drain region 8 side by the patterning treatment, and extends to the upper portion of the other channel region 20. These conductor films 10S and 10D are coated by a planarization film 12. A pixel electrode 14 of ITO or the like is formed on the planarization film 12 by the patterning treatment. The pixel electrode 14 is electrically connected to the drain region 8 of the thin film transistor 3 through a contact hole formed in the planarization film 12 and the conductor film 10D for connection.

According to this embodiment, the thin film transistor 3 is designed so that a pair of channel regions 20 confronting a pair of gate electrodes 5 are formed in the semiconductor thin film 2, and the conductor films 10S, 10D are formed on the surface of the interlayer insulating film 9 so as to be overlapped with the respective channel regions 20. In order to achieve the effect of the present invention, the electric shield may be formed so as to be overlapped with at least one channel region 20. Further, metal other than aluminum may be used for the conductor films 10S, 10D. Alternatively, the pixel electrode 14 may be extended to the upper portion of the channel region so that it serves as electric shield.

The thin film transistor 3 is used for the switching driving of the pixel electrode 14, and alternated video signals are applied to the thin film transistor 3. Accordingly, in the actual switching operation, the source region 7 and the drain region 8 are alternately replaced by each other. In other words, the potential of the conductor films 10S, 10D is varied. It is necessary to set the film thickness of the interlayer insulating film 9 and the stopper 6 so that the potential does not exceed the threshold voltage at the back gate side of the thin film transistor 3.

When a display device is fabricated by using the thin film semiconductor device of this embodiment, one insulating substrate 60 is joined to the other insulating substrate 1 at a predetermined interval. The one insulating substrate 60 is formed of glass or the like, and a counter electrode 61 is beforehand formed on the surface thereof. For example, liquid crystal is filled as the electrooptical material 50 in the gap between both the substrates 60, 1.

Figure 6:
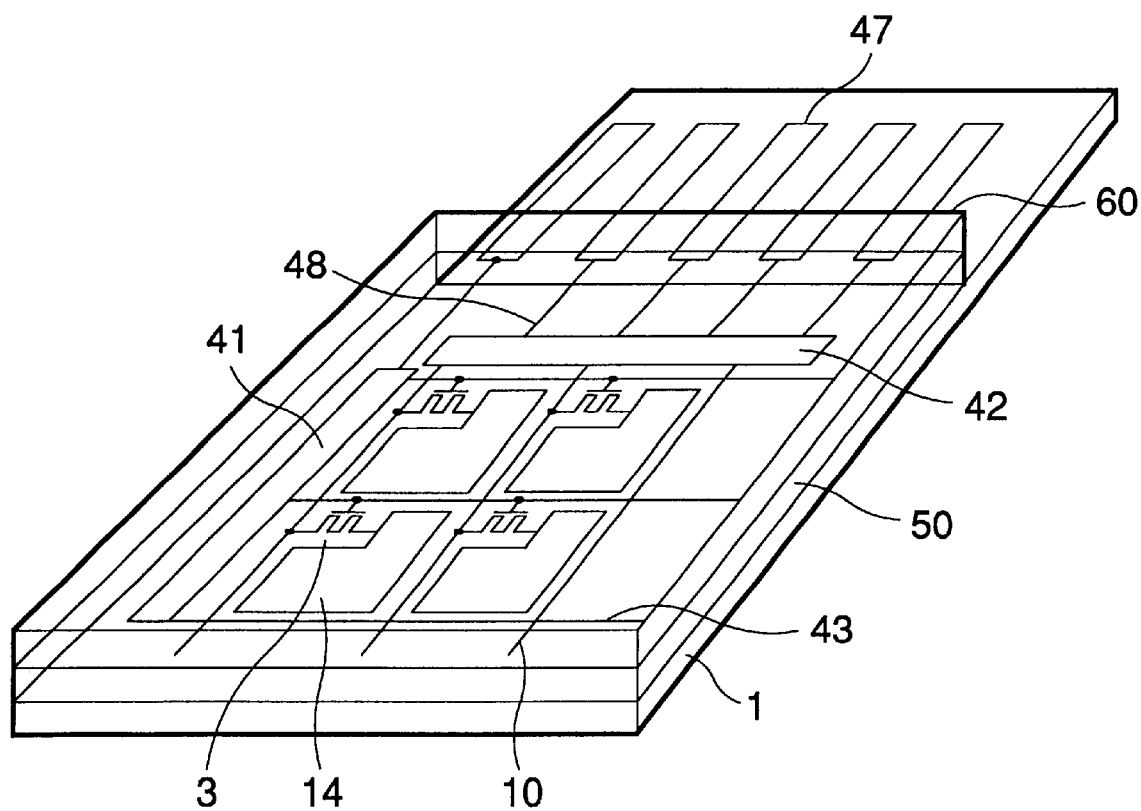
FIG. 6 is a perspective view showing a display device according to the present invention.

FIG. 6 is a perspective view showing an example of an active matrix type liquid crystal display device in which the thin film semiconductor device according to the present invention is fabricated as a driving board.

The display device has such a structure that the electrooptical material 50 formed of liquid crystal or the like is held between the driving board 1 and the counter board 60. A pixel array portion and a peripheral circuit portion are integrated in the driving board 1. The peripheral circuit portion is divided into a vertical scan circuit 41 and a horizontal scan circuit 42. Terminal electrodes 47 for external connection are formed at the upper end side of the driving board 1. Each terminal electrode 47 is connected through a wire 48 to the vertical scan circuit 41 and the horizontal scan circuit 42. Gate wires 43 and signal wires 10 which cross each other are formed in the pixel array portion. The gate wires 43 are connected to the vertical scan circuit 41, and the signal wires 10 are connected to the horizontal scan circuit 42. The pixel electrode 14 and the thin film transistor 3 for driving the pixel electrode 14 are formed at the cross portion between the wires 43, 10. The thin film transistor 3 has the double gate structure shown in FIG. 5. The thin film transistors constituting the vertical scan circuit 41 and the horizontal scan circuit 42 have the single gate structure shown in FIG. 3A. A counter electrode (not shown) is also formed on the inner surface of the counter board 60.

As described above, according to the present invention, the conductor film is formed on the surface of the interlayer insulating film so as to be overlapped with the channel region, thereby electrically shielding the channel region from the outside, whereby the factor of instabilizing the operation of the thin film transistor having the bottom gate structure is removed, and thus the stable operation can be ensured. Therefore, there can be provided high-reliability and high-quality devices.

What is claimed is:

1. A thin film semiconductor device comprising:
   an insulating substrate;
   a plurality of thin film transistors integrated on said insulating substrate, each thin film transistor including:
   a gate electrode,
   a gate insulating film,
   a semiconductor thin film having a source region, a drain region, and a channel region formed to confront the gate electrode and disposed between the source and the drain regions, and
   an interlayer insulating film formed to cover the channel region and partially extend over both the source region and the drain region, wherein the gate electrode, the gate insulating film, the semiconductor thin film, and the interlayer insulating film are laminated in this order onto the insulating substrate; and a conductor film formed on the surface of said interlayer insulating film so as to be connected to one of the source region or the drain region and to extend from the one region beyond a length of said channel region.

2. The thin film semiconductor device as claimed in claim 1, wherein said conductor film has a width dimension larger than that of said channel region.

3. The thin film semiconductor device as claimed in claim 1, wherein said thin film transistor includes a pair of channel regions which confront a pair of gate electrodes and formed in said semiconductor thin film, and a conductor film is formed on the surface of said interlayer insulating film so as to be overlapped with at least one of said channel regions.

4. A display device, comprising:

a first and a second insulating substrate that are connected to each other through a predetermined gap;

an electrooptical material held in the predetermined gap;

a counter electrode formed in the first insulating substrate; and a plurality of pixel electrodes and a plurality of thin film transistors which are integrated on the second insulating substrate, wherein each thin film transistor comprises:

a gate electrode, a gate insulating film, a semiconductor thin film having a source region, a drain region, and a channel region formed to confront the gate electrode and disposed between the source and the drain regions, an interlayer insulating film formed to cover the channel region and partially extend over both the source region and the drain region, wherein the gate electrode, the gate insulating film, the semiconductor thin film, and the interlayer insulating film are laminated in this order onto the insulating substrate, and a conductor film formed on the surface of said interlayer insulating film so as to be connected to one of the source region or the drain region and to extend from the one region beyond a length of said channel region.

5. The display device as claimed in claim 4, wherein said conductor film has a width dimension larger than that of said channel region.

6. The display device as claimed in claim 4, wherein said thin film transistor includes a pair of channel regions which confront a pair of gate electrodes and are formed in said semiconductor thin film, and a conductor film is formed on the surface of said interlayer insulating film so as to be overlapped with at least one of said channel regions.

7. A thin film semiconductor device, comprising:

an insulating substrate;

a plurality of thin film transistors integrated on the insulating substrate, each thin film transistor including:

a first and a second gate electrode both formed on the insulating substrate, a gate insulating film formed to cover the first and the second gate electrodes, a semiconductor thin film having a source region, a drain region, a first channel region and a second channel region, the first channel region being formed to confront the first gate electrode, the second channel region being formed to confront the second gate electrode, the first and the second channel regions being disposed between the source and the drain regions, and an interlayer insulating film formed to cover the first and the second channel regions of the semiconductor thin film; and a conductor film formed on the surface of said interlayer insulating film so as to be connected to one of the source region or the drain region and to extend beyond at least one of the channel regions.

* * * * *